US008140943B1

(12) United States Patent
Wu et al.

(10) Patent No.: US 8,140,943 B1
(45) Date of Patent: *Mar. 20, 2012

(54) PARITY INSERTION FOR INNER ARCHITECTURE

(75) Inventors: Zining Wu, Los Altos, CA (US); Panu Chaichanavong, Mountain View, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/089,733

(22) Filed: Apr. 19, 2011

Related U.S. Application Data

(63) Continuation of application No. 11/789,334, filed on Apr. 24, 2007, now Pat. No. 7,934,143.

(60) Provisional application No. 60/794,407, filed on Apr. 24, 2006, provisional application No. 60/797,275, filed on May 3, 2006.

(51) Int. Cl.
*G11C 29/00* (2006.01)
(52) U.S. Cl. ........................ 714/769; 714/801
(58) Field of Classification Search .................. 714/769, 714/801
See application file for complete search history.

(56) References Cited

U.S. PATENT DOCUMENTS

| 6,633,856 | B2 | 10/2003 | Richardson et al. |
| 6,789,227 | B2 | 9/2004 | De Souza et al. |
| 6,895,547 | B2 | 5/2005 | Eleftheriou et al. |
| 7,302,621 | B2 | 11/2007 | Edmonston et al. |
| 7,571,372 | B1 | 8/2009 | Burd et al. |
| 2002/0051501 | A1 | 5/2002 | Demjanenko et al. |
| 2007/0043997 | A1 | 2/2007 | Yang et al. |
| 2007/0101229 | A1* | 5/2007 | Niu et al. ............ 714/752 |
| 2008/0022194 | A1 | 1/2008 | Siegel et al. |

OTHER PUBLICATIONS

Chaichanavong, Panu et al; "Tensor-Product Parity Code for Magnetic Recording"; IEEE Transactions on Magnetics, vol. 42, No. 2, Feb. 2006; pp. 350-352.
Cideciyan, Roy et al; "Noise Predictive Maximum Likelihood Detection Combined with Parity-Based Post-Processing"; IEEE Transactions on Magnetics, vol. 37, No. 2, Mar. 2001; pp. 714-720.
Conway, Thomas; "A New Target Response with Parity Coding for High Density Magnetic Recording Channels"; IEEE Transactions on Magnetics, Vo. 34, No. 4, Jul. 1998; pp. 2382-2386.
Fan, John L.; "A Modified Concatenated Coding Scheme, with Applications to Magnetic Data Storage"; IEEE Transactions on Information Theory, vol. 44, No. 4, Jul. 1998; pp. 1565-1574.
Feng, Weishi et al; "On the Performance of Parity Codes in Magnetic Recording Systems"; 2000 IEEE; pp. 1877-1881.
K.A.S. Immink; "Codes for Mass Data Storage Systems"; 1999; pp. 221-223.
Marcus, Brian et al; "Finite-State Modulation Codes for Data Storage"; IEEE Journal on Selected Areas in Communications, vol. 10, No. 1, Jan. 1992; pp. 5-37.
Morita, Toshihiko et al; "Efficiency of Short LDPC Codes Combined with Long Reed-Solomon Codes for Magnetic Recording Channels"; IEEE Transactions on Magnetics, vol. 40, No. 4, Jul. 2004; pp. 3078-3080.

(Continued)

*Primary Examiner* — M. Mujtaba K Chaudry

(57) ABSTRACT

A coding system for digital data. The coding system includes a constrained encoder module configured to generate encoded data based on a first constrained code; a bit insertion module configured to insert at least one bit location in the encoded data; and an inner encoding module configured to (i) generate inner-code parity bits based on the encoded data, and (ii) program the inner-code parity bits into the at least one bit location.

19 Claims, 14 Drawing Sheets

OTHER PUBLICATIONS

Ryan, William et al; "Performance of High Rate Turbo Codes on a PR4-Equalized Magnetic Recording Channel"; 1998 IEEE; pp. 947-951.

Widmer, A.X. et al; "A DC-Balanced, Partitioned-Block, 8B/10B Transmission Code"; IBM J. Res. Develop, vol. 27, No. 5, Sep. 1983; pp. 440-451.

* cited by examiner

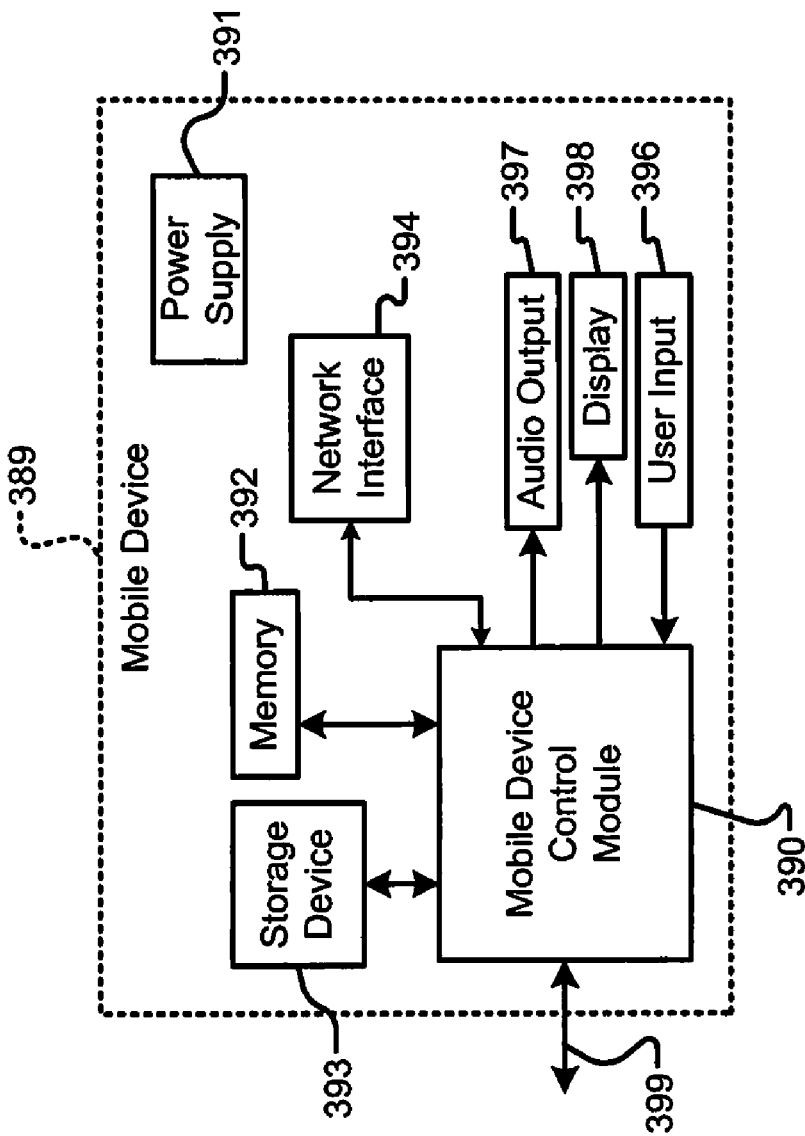

PARITY INSERTION FOR INNER ARCHITECTURE

CROSS-REFERENCE TO RELATED APPLICATIONS

This application is a continuation of U.S. application Ser. No. 11/789,334 (now U.S. Pat. No. 7,934,143), filed on Apr. 24, 2007, which claims the benefit of (i) U.S. Provisional Application No. 60/794,407, filed on Apr. 24, 2006, and (ii) U.S. Provisional Application No. 60/797,275, filed on May 3, 2006. The disclosures of the applications referenced above are incorporated herein by reference.

FIELD

The present disclosure relates to parity bits in encoded data.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Digital data can be communicated through various channels. Examples of channels include magnetic storage media, optical storage media, wired communication links, wireless communication links, and the like. During transmission and/or recording onto the media, the integrity and recoverability of the data can be enhanced by various codes. The codes can be applied in combination and provide functions such as error correction, DC bias limiting, channel effect estimation, and the like.

Referring now to FIG. 1, a functional block diagram is shown of a coding system 10 in accordance with the prior art. Coding system 10 includes an error correcting code (ECC) encoder module 12 that receives data and encodes it with an ECC, such as a Reed-Solomon (RS) code. A constrained encoder module 14 receives the ECC encoded data and further encodes it with a constrained code, such as a run-length limited (RLL) code and/or a DC-free code. A channel 16 receives the encoded data from constrained encoder module 14. A constrained decoder module 18 receives the encoded data from channel 16 and decodes the constrained code. Constrained decoder module 18 communicates the data to an ECC decoder module 20. ECC decoder module 20 restores the original data.

Referring now to FIG. 2, a functional block diagram is shown of an alternative coding system 10'. Coding system 10' is similar to coding system 10 of FIG. 1, except constrained encoder module 14 is upstream of ECC encoder module 12 and ECC decoder module 20 is upstream of constrained decoder module 18. The order of ECC and constrained code encoders and decoders are reversed from FIG. 1 to avoid error propagation through channel 16 and to improve a rate of the constrained code.

In coding system 10', ECC encoder module 12 may destroy the constrained property, such as a RLL and/or DC-bias limit, of the constrained code. A second constrained encoder module (shown in FIG. 6) may be needed to encode ECC parity bits that are generated by ECC encoder module 12. More discussion on such a scheme can be found in J. L. Fan and A. R. Calderbank, "A Modified Concatenated Coding Scheme, with Applications to Magnetic Data Storage," IEEE Transactions on Information Theory, vol. 44, no. 4, pp. 1565-1574, July 1998, which is hereby incorporated by reference in its entirety.

Referring now to FIG. 3, a functional block diagram is shown of a coding system 30 that employs an inner code in addition to the ECC and constrained code. The inner code may improve the data integrity through channel 16. The inner code can take advantage of soft information such as probability, reliability metric, log likelihood ratio, and the like, for decoding the data from channel 16. An inner encoder module 32 applies the inner code to the data stream just prior to reaching channel 16. An inner decoder module 34 receives encoded data from channel 16 and decodes the inner code based on soft information that is associated with properties of channel 16.

Examples of inner codes include single and multi-parity codes, turbo codes, low-density parity check codes, tensor-product codes, and the like. Single and multi-parity codes are discussed in T. Conway, "A New Target Response with Parity Coding for High Density Magnetic Recording Channels," IEEE Transactions on Magnetics, vol. 34, no. 4, pp. 2382-2386, July 1998 and R. D. Cideciyan, J. D. Coker, E. Eleftheriou, and R. L. Galbraith, "Noise Predictive Maximum Likelihood Detection Combined with Parity-Based Post-Processing," IEEE Transactions on Magnetics, vol. 37, no. 2, pp. 714-720, March 2001, and W. Feng, A. Vityaev, G. Burd, and N. Nazari, "On the Performance of Parity Codes in Magnetic Recording Systems," Proceedings of IEEE GLOBECOM '00, pp. 1877-1881, November 2000, which are hereby incorporated by reference in their entirety. Turbo codes are discussed in W. E. Ryan, "Performance of High Rate Turbo Codes on a PR4-Equalized Magnetic Recording Channel," Proceedings of IEEE ICC '98, pp. 947-951, June 1998, which is hereby incorporated by reference in its entirety. Low-density parity-check codes are discussed in T. Morita, M. Ohta, and T. Sugawara, "Efficiency of Short LDPC Codes Combined with Long Reed-Solomon Codes for Magnetic Recording Channels," IEEE Transactions on Magnetics, vol. 40, no. 4, pp. 3078-3080, July 2004, which is hereby incorporated by reference in its entirety. Tensor-product codes are discussed in P. Chaichanavong and P. H. Siegel, "Tensor-Product Parity Code for Magnetic Recording," IEEE Transactions on Magnetics, vol. 42, no. 2, pp. 350-352, February 2006, and J. Xu, P. Chaichanavong, Z. Wu, and G. Burd, "Tensor Product Codes Containing an Iterative Code," U.S. Patent Application (MP0767)., which are hereby incorporated by reference in their entirety.

Referring now to FIG. 4, the data stream is shown at various points in the transmitter portion of coding system 30. Bits $a_0$-$a_{19}$ represent bits of data that will be transmitted or recorded in channel 16. ECC encoder module 12 processes bits $a_0$-$a_{19}$ to generate ECC parity bits $r_0$-$r_{19}$. ECC parity bits $r_0$-$r_{19}$ can be in a contiguous block that is concatenated with data bits $a_0$-$a_{19}$. Inner encoder module 32 inserts inner-code parity bits 36 of the inner code at predetermined positions among bits $a_0$-$a_{19}$. The predetermined positions are based on the inner code.

Referring now to FIG. 5, a functional block diagram is shown of a hard disk drive (HDD) 40. HDD 40 can employ the ECC, constrained code, and inner code to read and write encoded data on a rotating magnetic platter 42. The encoded data is stored on platter 42 in a pattern of tracks 44. Magnetic platter 42 and tracks 44 implement channel 16 of FIG. 3. Tracks 44 are divided into a plurality of sectors 46.

Each sector 46 can include servo data that is written at predetermined locations on platter 42. The servo data is used by a hard drive control (HDC) module 48 to determine the position of a read/write (R/W) head 50 with respect to platter 42. HDC module 48 communicates with a motor control module 52 that controls the positions and velocities of platter 42 and R/W head 50. Since the servo data is written at predetermined locations and cannot be moved, it can be challenging for HDC module 48 to anticipate when the encoded data and inner code parity bits 36 will be written to a portion of platter 42 that includes the immovable servo data. This is particularly true when ECC encoder module 12 and constrained encoder module 14 are implemented in HDC module 48, and inner encoder module 32 is implemented in a R/W channel module 54.

A symbol clock cadence module 56 varies a clock frequency relationship between HDC module 48 and R/W channel module 54. Symbol clock cadence module 56 receives information from R/W channel module 54 regarding the positions of inner-code parity bits 36 and receives information from HDC module 48 regarding expected positions of the servo data on platter 42. Based on the information, symbol clock cadence module 56 varies a throughput or cadence relationship between HDC module 48 and R/W channel module 54. Varying the cadence relationship prevents the encoded data and/or inner parity bits from being written to a location on platter 42 that already includes the servo data.

Referring now to FIG. 6, a functional block diagram is shown of pertinent parts of HDC module 48 and R/W channel module 54. ECC encoder module 12 can be implemented in HDC module 48 and can include a Reed-Solomon (RS) ECC encoder module 12A. RS ECC encoder module 12A generates the ECC parity bits. ECC encoder module 12 also includes a RLL encoder module 12B that encodes the ECC parity bits with a RLL code. A multiplexer 12C concatenates the encoded data from constrained encoder module 14 with the RLL-encoded ECC parity bits from RLL encoder module 12B. HDC module 48 can also include ECC decoder module 20 and constrained decoder module 18.

A data diagram 60 shows that the data stream at the output of ECC encoder module 12 includes the encoded data from constrained encoder module 14 and the RLL-encoded ECC parity bits from RLL encoder module 12B. A coding rate of RLL encoder module 12B can be lower than a coding rate of constrained encoder module 14.

R/W channel 54 can include inner encoder module 32 and inner decoder module 34. Inner decoder module 34 can also include a soft-output Viterbi algorithm (SOVA) module 34A that generates soft information based on characteristics of channel 16. Inner decoder module 34 decodes data that it receives from channel 16 based on the soft output.

A second data diagram 62 shows that the RLL coded data is interspersed with inner-code parity bits 36 that are generated by inner encoder module 32. Since inner encoder module 32 generates inner-code parity bits 36 independently of HDC module 48, it is challenging for HDC module 48 to anticipate where inner-code parity bits 36 will be recorded on platter 42 (which is included in channel 16). It is similarly challenging to HDC module 48 to avoid writing to the locations on platter 42 that include the servo data.

Referring now to FIG. 7, a data diagram 70 shows an example pattern of inner-code parity bits 36. Inner encoder module 32 can insert two inner-code parity bits 36 for each twenty bits of encoded data from ECC encoder module 12. It should be appreciated that other numbers of bits may also be used depending on a desired efficiency of data throughput in channel 16.

Referring now to FIG. 8, data diagrams 76 and 78 show an effect of the pattern of inner-code parity bits 36 that is shown in FIG. 7. ECC encoder module 12 outputs the encoded data and RLL-encoded ECC parity bits in blocks of ten bits, which are shown generally at 76. Inner encoder module 32 inserts two inner-code parity bits 36 for every twenty bits of the encoded data that it receives, which is shown generally at 78. The inserted two bits cause the ten-bit blocks of encoded data to become out of phase between HDC module 48 (which includes ECC encoder module 12) and R/W channel module 54 (which includes inner encoder module 32). HDC module 48 therefore needs symbol clock cadence module 56 (shown in FIG. 5) to meter a symbol rate of the bits that are shown at 76 and 78 and thereby avoid writing bits at locations on platter 46 that include the predetermined servo data.

SUMMARY

In general, in one aspect, this specification describes a coding system for digital data. In one implementation, the coding system includes a constrained encoder module configured to generate encoded data based on a first constrained code; a bit insertion module configured to insert at least one bit location in the encoded data; and an inner encoding module configured to (i) generate inner-code parity bits based on the encoded data, and (ii) program the inner-code parity bits into the at least one bit location.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 12G is a functional block diagram of a mobile device.

DETAILED DESCRIPTION

Figure 1:
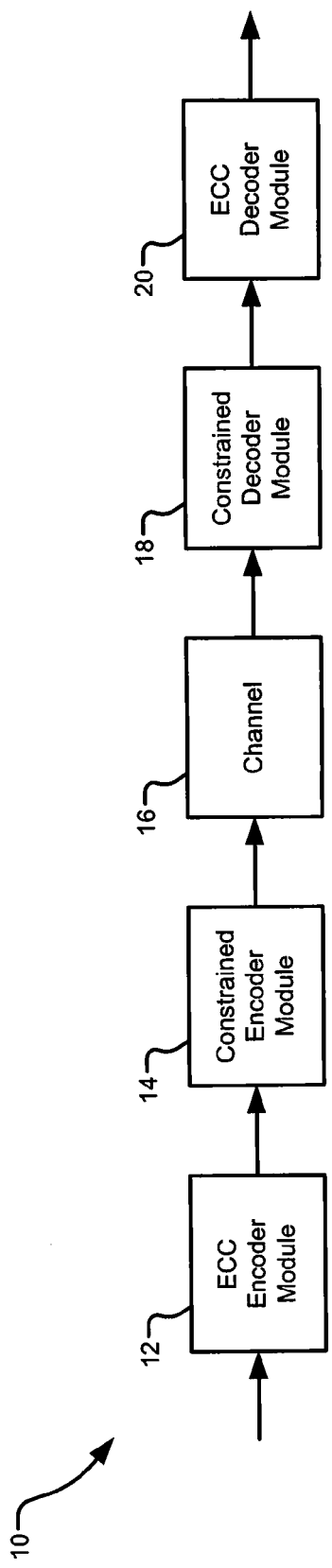
FIG. 1 is a functional block diagram of a first coding system in accordance with the prior art.
Figure 2:
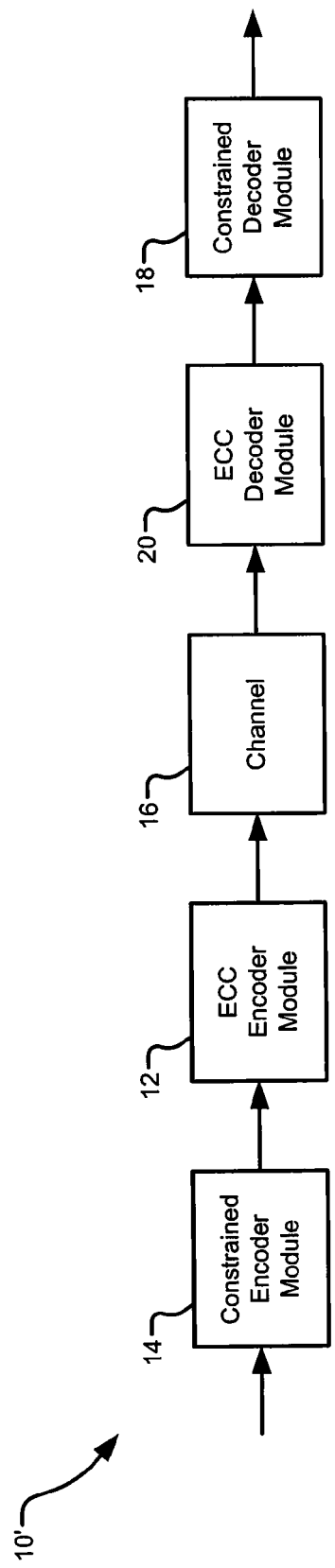
FIG. 2 is a functional block diagram of a second coding system in accordance with the prior art.
Figure 3:
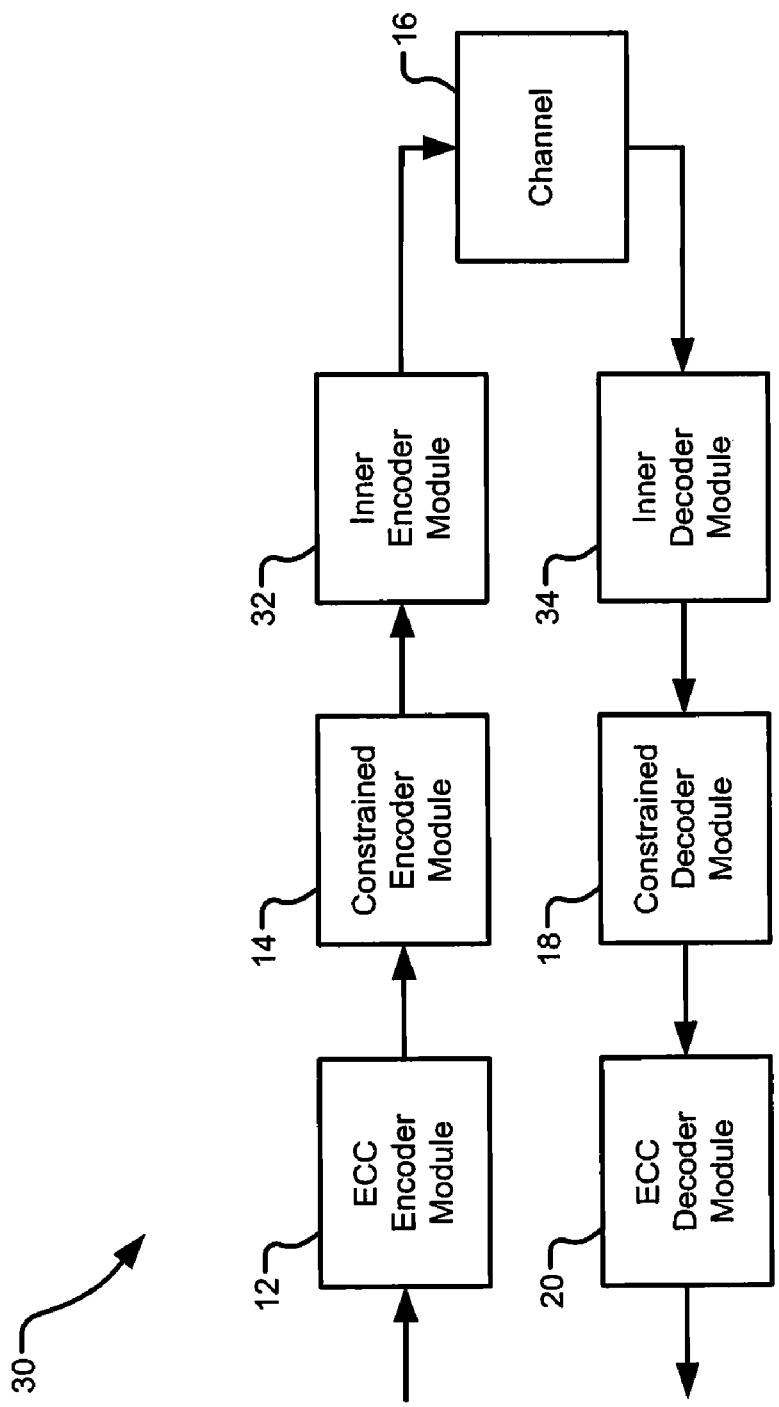
FIG. 3 is a functional block diagram of an inner coding system in accordance with the prior art.
Figure 4:
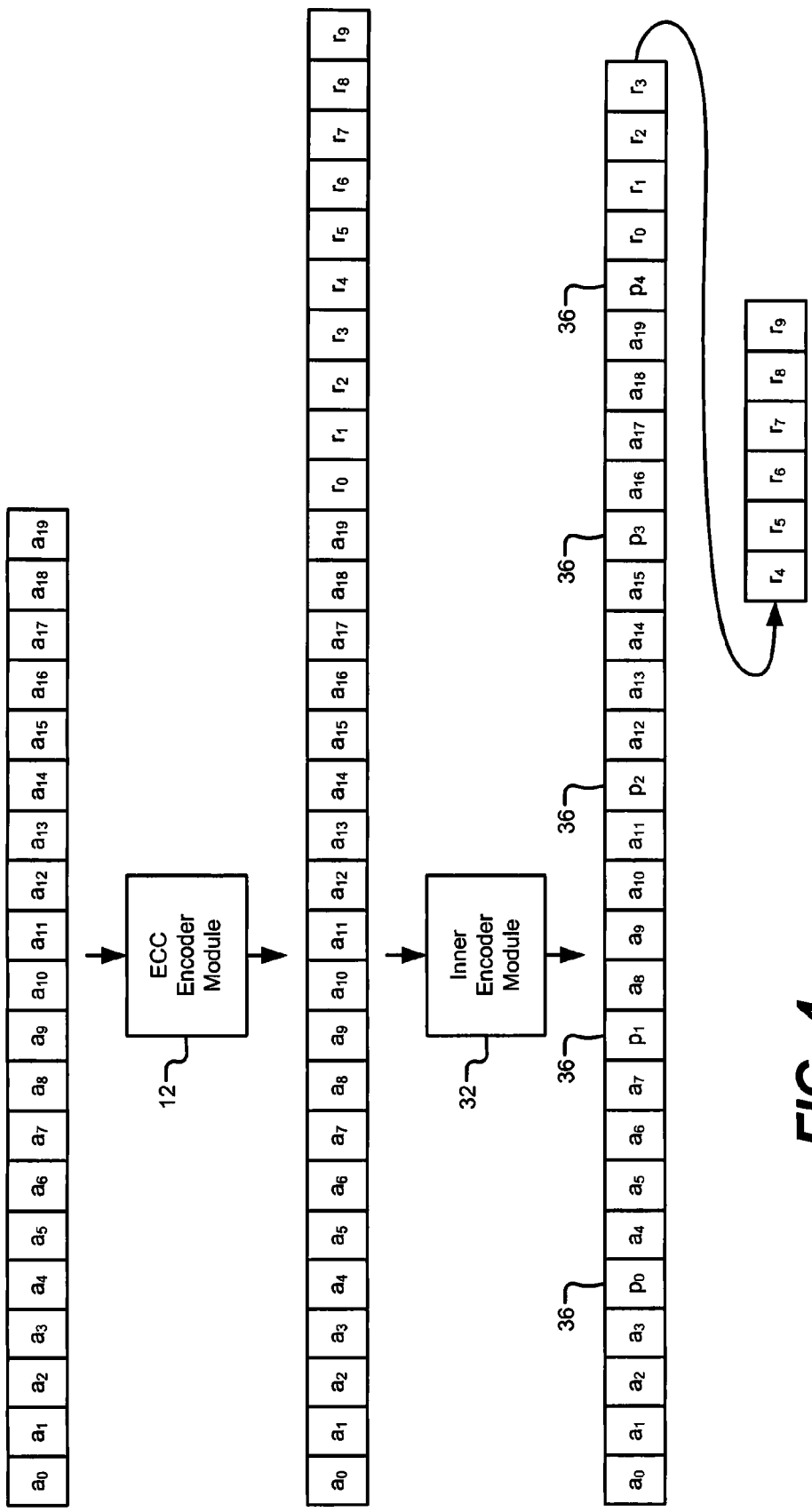
FIG. 4 is a data diagram of data at various points in the coding system of FIG. 3.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 9:
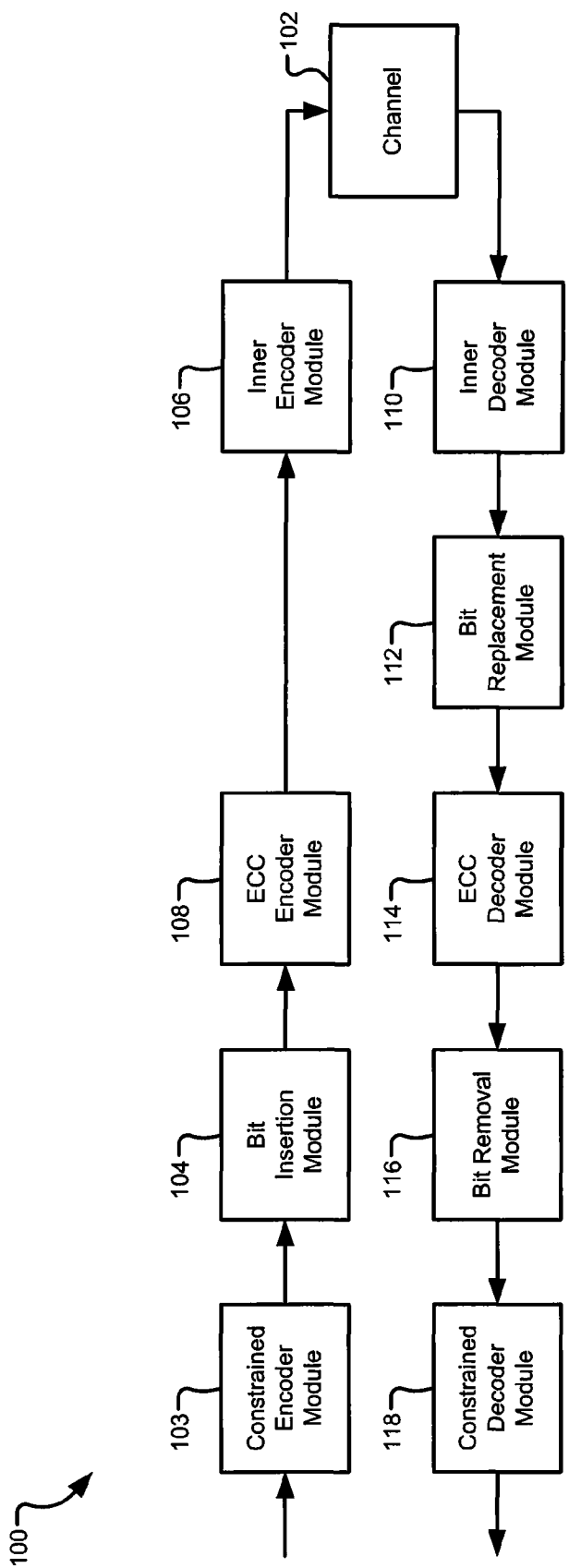
FIG. 9 is a functional block diagram of an improved inner coding system.

Referring now to FIG. 9, a functional block diagram is shown of a coding system 100. Coding system 100 can be employed to encode and decode data that is stored and/or communicated through a channel 102. Channel 102 can include magnetic and/or optical media such as is used in a hard disk drive (HDD) and/or digital versatile disc (DVD) drive. Coding system 100 employs a coding scheme that employs a constant quantity of bits per encoded symbol throughout several layers of coding in the data stream. The constant quantity of bits facilitates synchronizing events between coding system 100 and another component or subsystem. An example of another component or subsystem includes servo data that is recorded at predetermined positions on the magnetic media of the HDD and may not be overwritten by the encoded data of coding system 100.

Coding system 100 includes a constrained encoder module 103 that encodes incoming data based on a constrained code. Examples of constrained codes include run-length limiting (RLL) and DC-free codes. A bit insertion module 104 inserts bits at predetermined positions in the encoded data from constrained encoder module 103. The inserted bits initially are set to a predetermined value, such as all ones, all zeros, or a combination thereof. The number of inserted bits corresponds with a number of inner-code parity bits 204 that are employed by an inner encoder module 106. The locations of the predetermined positions are selected such that after the inserted bits pass through an error-correcting code (ECC) encoder module 108 then the inserted bits will be in positions that correspond with positions that inner encoder module 106 will write the values of the inner-code parity bits.

When constrained encoder module 103 implements an interleaved code with an interleaved or I constraint, the predetermined positions may be adjacent, such as a pair of adjacent bits. The I-constraint limits a run-length of the encoded data in both odd and even interleaves. Inner encoder module 106 communicates the encoded data and populated parity bits to channel 102.

In some embodiments, bit insertion module 104 can be implemented with a "dummy" inner encoder that leaves its parity bits set to the predetermined value regardless of the data it receives from constrained encoder module 103.

A receiver or read portion of coding system 100 includes an inner decoder module 110 that receives the encoded data from channel 102. Inner decoder module 110 decodes the encoded data based on the inner code and soft data based on characteristics of channel 102. A bit replacement module 112 receives the decoded data from inner decoder module 110 and resets the inner-code parity bits to the predetermined values that are employed by bit insertion module 104. An ECC decoder module 114 receives the data from bit replacement module 112, processes the data based on the ECC, and communicates the processed data to a bit removal module 116. Bit removal module 116 removes the parity bits that were inserted by bit insertion module 104. Bit removal module 116 then communicates the data to constrained decoder module 118. Constrained decoder module 118 decodes the data based on the constrained code.

Figure 10:
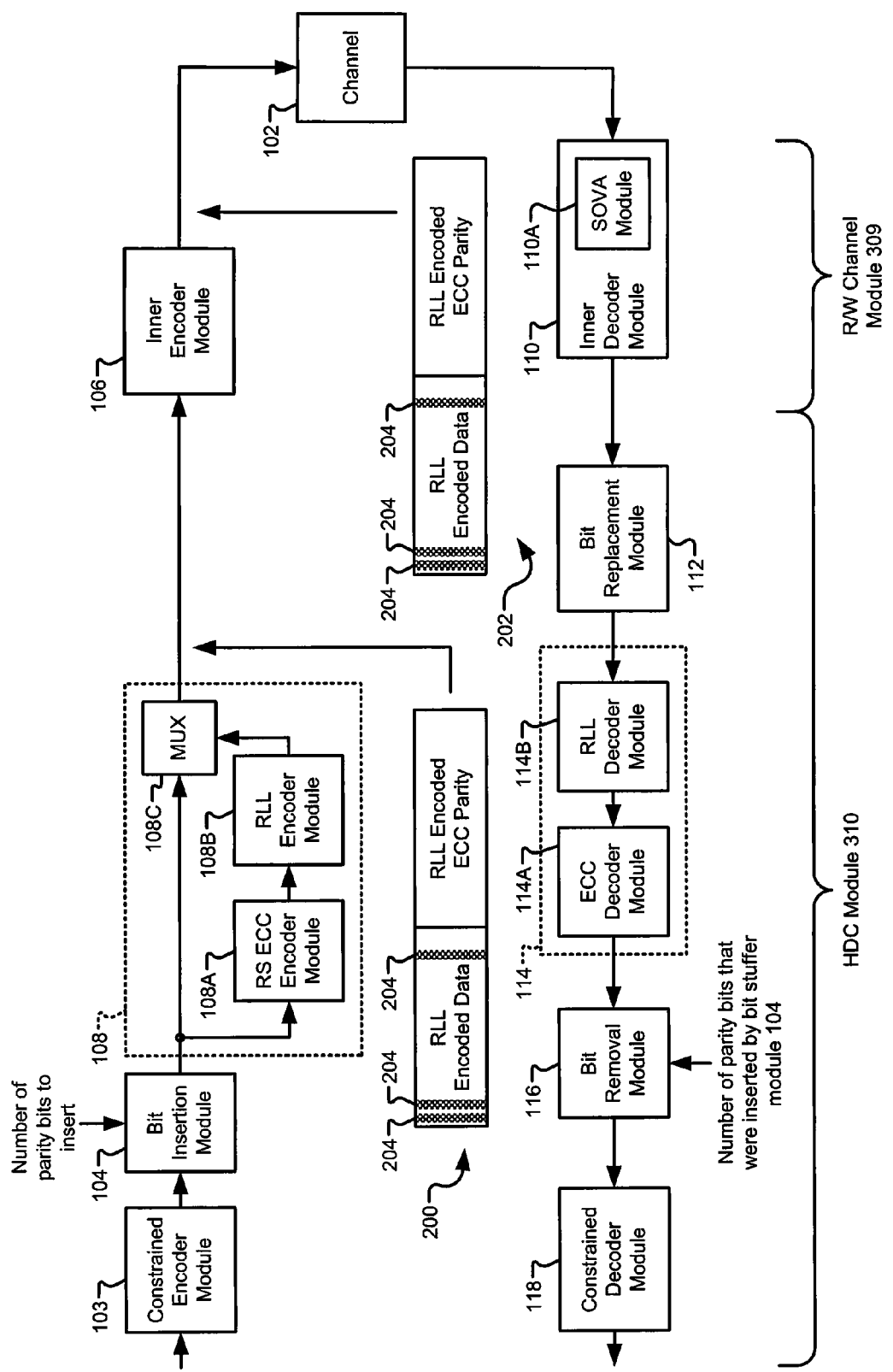
FIG. 10 is a functional block diagram of a HDC module and a R/W channel module that employ the coding system of FIG. 9.

Referring now to FIG. 10, an embodiment of coding system 100 is shown in more detail. ECC encoder module 108 can include a Reed-Solomon (RS) ECC encoder module 108A. RS ECC encoder module 108A generates ECC parity bits based on the data from bit insertion module 104. ECC encoder module 108 can also include a RLL encoder module 108B that encodes the ECC parity bits. A multiplexer 108C concatenates the data from bit insertion module 104 with the RLL-encoded ECC parity bits from RLL encoder module 108B.

Figure 12A:
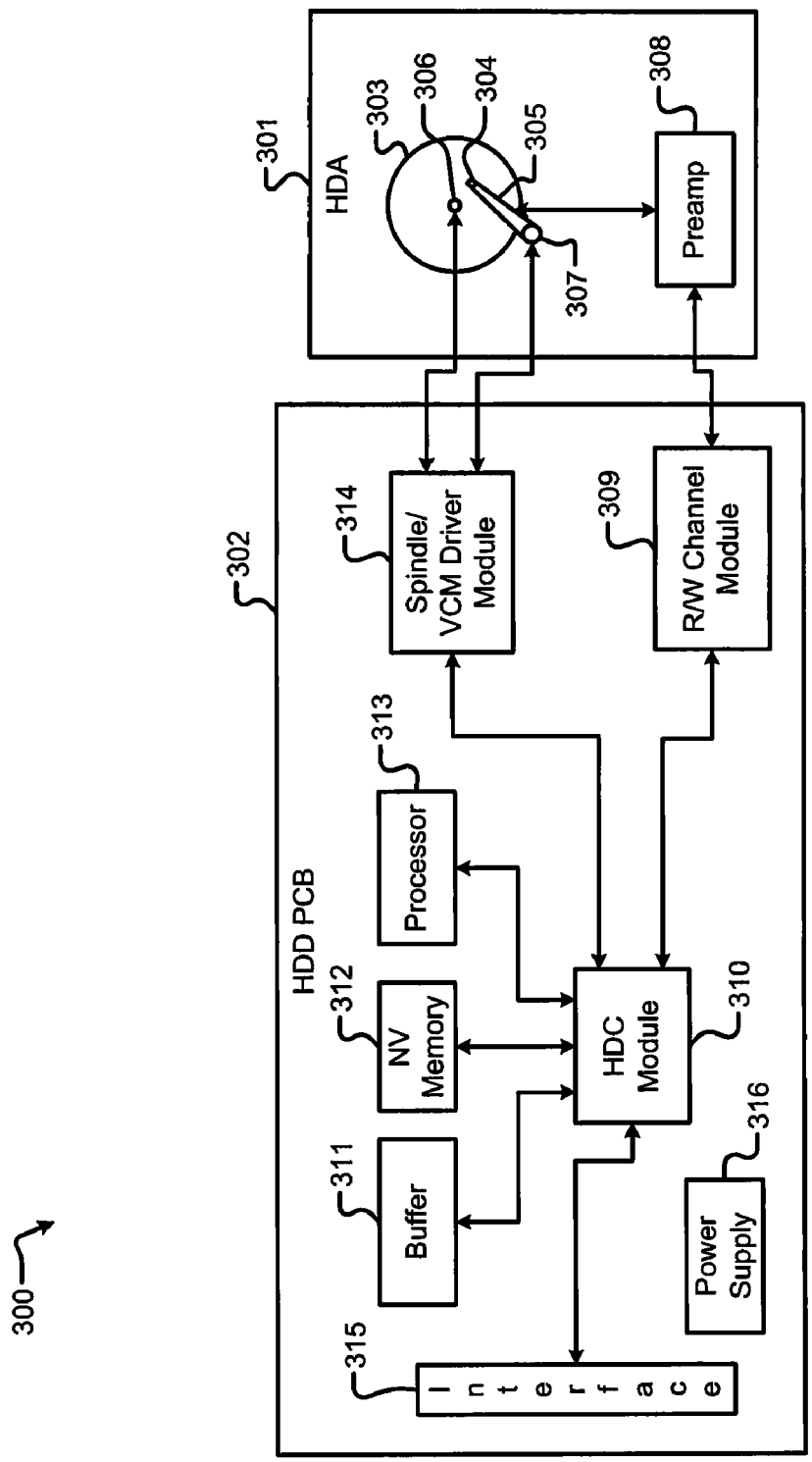
FIG. 12A is a functional block diagram of a HDD.

Constrained encoder module 102, bit insertion module 104, and ECC encoder module 108 can be implemented in a hard disk controller (HDC) module 310 (shown in FIG. 12A). Bit replacement module 112, ECC decoder module 114, bit removal module 116, and constrained decoder module 118 may also be implemented, alone or in combination, in HDC module 310. ECC decoder module 114 may include a RLL decoder module 114B that decodes the RLL encoding that is applied to the ECC parity bits.

Inner encoder module 106 and inner decoder module 110 can be implemented in a R/W channel module 309 (shown in FIG. 12A). Iterative decoder module 110 can include a soft output Viterbi algorithm (SOVA) module 110A that generates soft information based characteristics of channel 102. Iterative decoder module 110 decodes the data received from channel 102 based on the soft information and the inner-code parity bits that were programmed by inner encoder module 106.

A first data diagram 200 shows that the data stream at the output of ECC encoder module 108 includes the RLL-encoded data from constrained encoder module 103 and the RLL-encoded ECC parity bits from RLL encoder module 108B. Interspersed among the RLL-encoded data are one or more of bit locations 204 that are inserted by bit insertion module 104.

Figure 5:
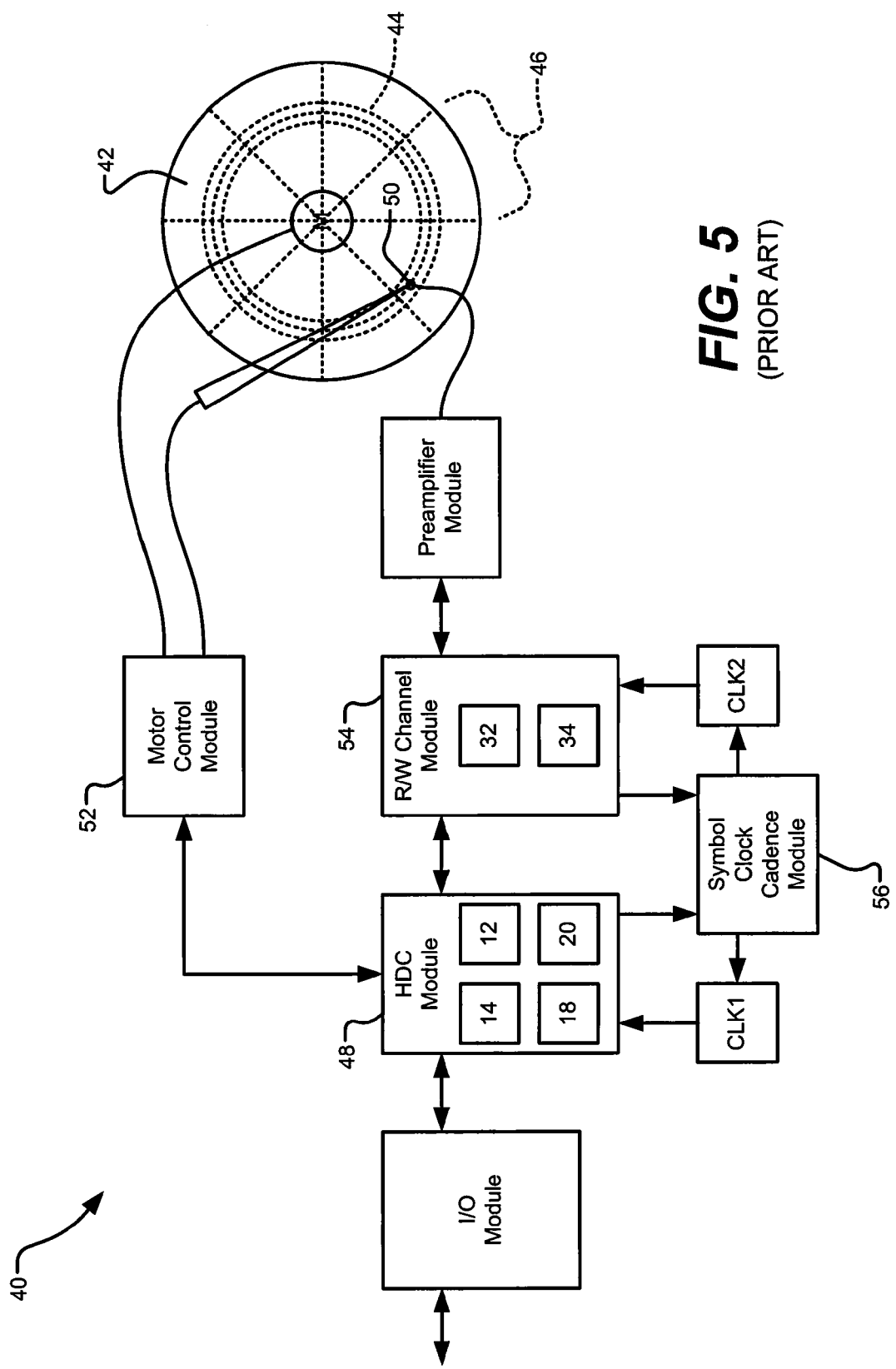
FIG. 5 is a functional block diagram of a hard disk drive (HDD) that employs the coding system of FIG. 3.
Figure 6:
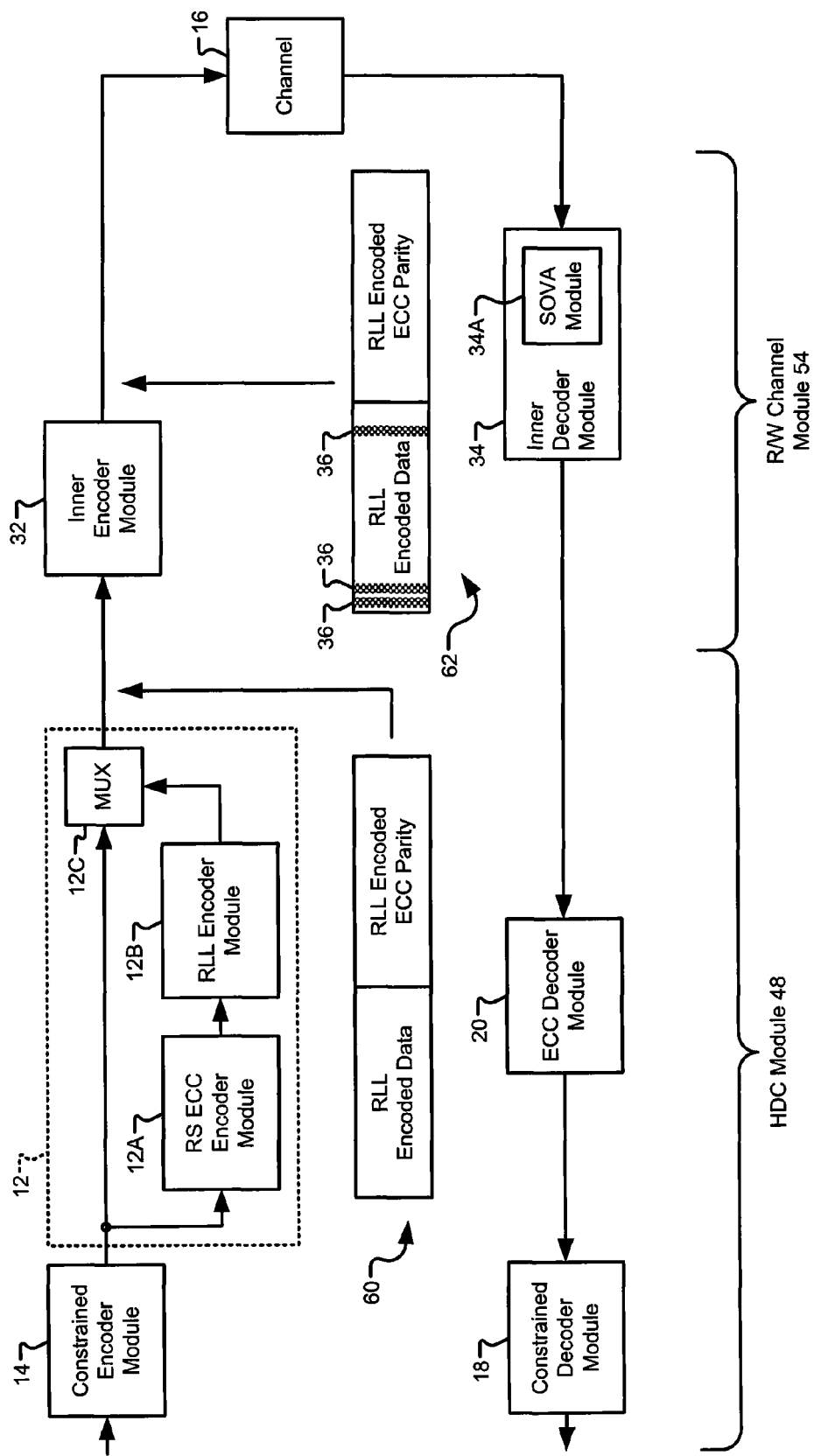
FIG. 6 is a functional block diagram of a hard drive control (HDC) module and read/write (R/W) channel module of FIG. 5.
Figure 7:
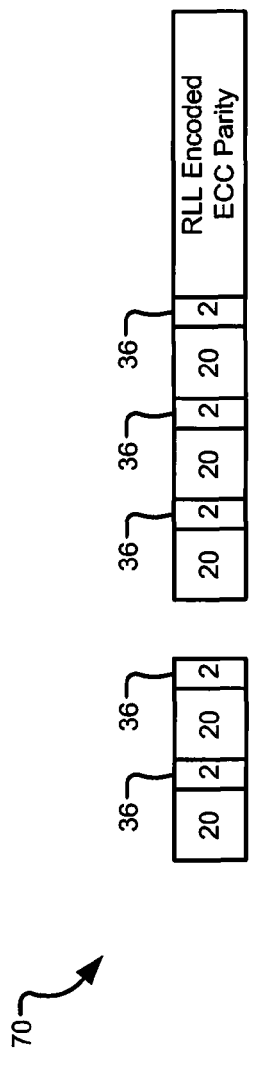
FIG. 7 is a data diagram of encoded data at a first location in the HDD of FIG. 5.
Figure 8:
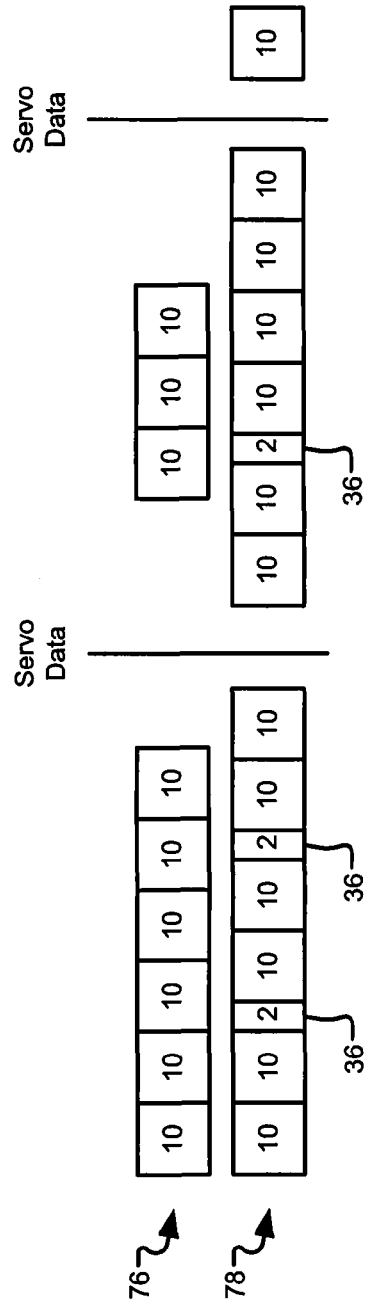
FIG. 8 is a data diagram of data encoded data at various locations in the HDD of FIG. 5.

A second data diagram 202 shows that bit locations 204 are populated with the inner-code parity bits from inner encoder module 106. Since the total number bits in data diagrams 200 and 202 are equal and can share common block boundaries, HDC module 310 can readily predict the timing of inner-code parity bits 204 as they enter channel 102. This ability to predict allows HDC module 310 to synchronize writing encoded data to channel 102 with other events that may occur in channel 102, such as the arrival of servo data on a HDD platter. This ability to predict is particularly true when HDC module 310 also controls a velocity and/or position of the HDD platter as is shown in FIG. 12A. The identical bit quantities and boundaries shown in data diagrams 200 and 202 also allow HDC module 310 and R/W channel 309 to share a common symbol rate or clock and thereby eliminate a need for symbol clock cadence module 56 of the prior art (shown in FIG. 5).

Figure 11:
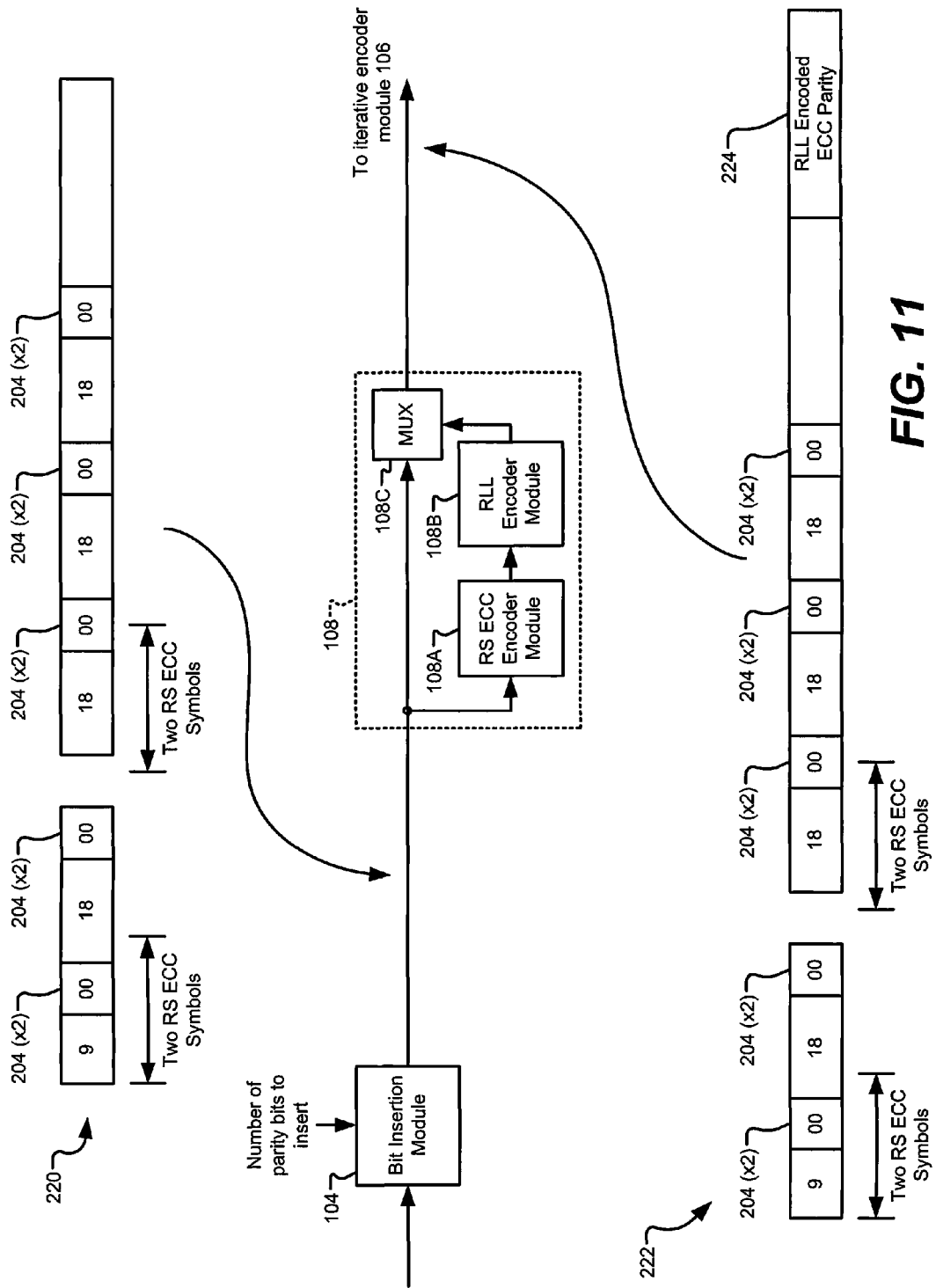
FIG. 11 is a data diagram of data at various locations in the coding system of FIG. 9.

Referring now to FIG. 11, an example implementation is shown of the encoded data stream at the respective outputs of bit insertion module 104 and ECC encoder module 108. The example implementation assumes that the quantity of inner encoder bits that are employed by inner encoder module 106 is evenly divisible by ten. It should be appreciated by those skilled in the art that other numbers of bits may also be employed without deviating from the spirit of this disclosure.

A data diagram 220 shows that bit insertion module 104 can insert bit locations 204 in pairs, e.g. space for two innercode parity bits for every eighteen bits of data that are received at the input of bit insertion module 104. There is an initial offset of nine bits. A total number of inserted bit locations will vary depending on the chosen inner code. Since ECC encoder module 108 generates the ECC parity bits based on the values stored in locations 204 but does not change the quantity or positions of inserted bit locations 204, the positions of inserted bit locations 204 are unchanged at the output of ECC encoder module 108, as shown in a data diagram 222. The RLL-encoded ECC parity bits are concatenated to the encoded data as shown at 224.

Referring now to FIGS. 12A-12G, various exemplary implementations incorporating the teachings of the present disclosure are shown.

Referring now to FIG. 12A, coding system 100 can be implemented in HDC module 310 and R/W channel module 309 of a hard disk drive (HDD) 300. The HDD 300 includes a hard disk assembly (HDA) 301 and a HDD PCB 302. The HDA 301 may include a magnetic medium 303, such as one or more platters that store data, and a read/write device 304. The read/write device 304 may be arranged on an actuator arm 305 and may read and write data on the magnetic medium 303. Additionally, the HDA 301 includes a spindle motor 306 that rotates the magnetic medium 303 and a voice-coil motor (VCM) 307 that actuates the actuator arm 305. A preamplifier device 308 amplifies signals generated by the read/write device 304 during read operations and provides signals to the read/write device 304 during write operations.

The HDD 300 also includes a buffer 311, nonvolatile memory 312, a processor 313, and a spindle/VCM driver module 314. The R/W channel module 309 processes data received from and transmitted to the preamplifier device 308 and can implement a portion of the coding scheme as shown in FIG. 10. The HDC module 310 controls components of the HDA 301 and can also implement a remaining portion of the coding scheme as shown in FIG. 10. The HDC module 310 also communicates with an external device (not shown) via an I/O interface 315. The external device may include a computer, a multimedia device, a mobile computing device, etc. The I/O interface 315 may include wireline and/or wireless communication links.

The HDC module 310 may receive data from the HDA 301, the read channel 309, the buffer 311, nonvolatile memory 312, the processor 313, the spindle/VCM driver module 314, and/or the I/O interface 315. The processor 313 may process the data, including encoding, decoding, filtering, and/or formatting. The processed data may be output to the HDA 301, the R/W channel 309, the buffer 311, nonvolatile memory 312, the processor 313, the spindleNCM driver module 314, and/or the I/O interface 315.

The HDC module 310 may use the buffer 311 and/or nonvolatile memory 312 to store data related to the control and operation of the HDD 300. The buffer 311 may include DRAM, SDRAM, etc. The nonvolatile memory 312 may include flash memory (including NAND and NOR flash memory), phase change memory, magnetic RAM, or multistate memory, in which each memory cell has more than two states. The spindleNCM driver module 314 controls the spindle motor 306 and the VCM 307. The HDD PCB 302 includes a power supply 316 that provides power to the components of the HDD 300.

Figure 12B:
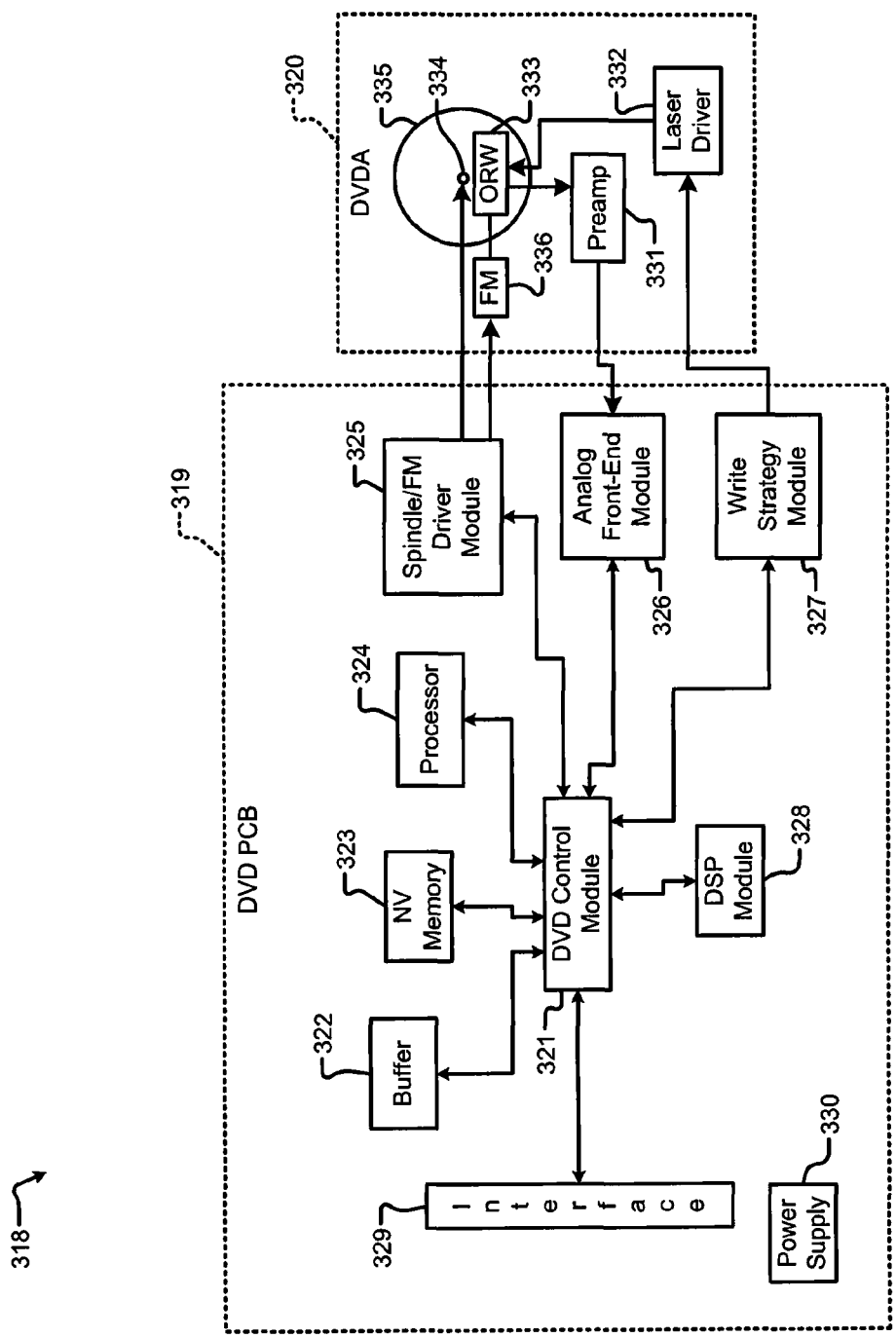
FIG. 12B is a functional block diagram of a DVD drive.

Referring now to FIG. 12B, coding system 100 can also be implemented in a DVD control module 310 of a DVD drive 318 or of a CD drive (not shown). The DVD drive 318 includes a DVD PCB 319 and a DVD assembly (DVDA) 320. The DVD PCB 319 includes DVD control module 321, a buffer 322, nonvolatile memory 323, a processor 324, a spindle/FM (feed motor) driver module 325, an analog front-end module 326, a write strategy module 327, and a DSP module 328.

The DVD control module 321 controls components of the DVDA 320 and communicates with an external device (not shown) via an I/O interface 329. The external device may include a computer, a multimedia device, a mobile computing device, etc. The I/O interface 329 may include wireline and/or wireless communication links.

The DVD control module 321 may receive data from the buffer 322, nonvolatile memory 323, the processor 324, the spindle/FM driver module 325, the analog front-end module 326, the write strategy module 327, the DSP module 328, and/or the I/O interface 329. The processor 324 may process the data, including encoding, decoding, filtering, and/or formatting. The DSP module 328 performs signal processing, such as video and/or audio coding/decoding. The processed data may be output to the buffer 322, nonvolatile memory 323, the processor 324, the spindle/FM driver module 325, the analog front-end module 326, the write strategy module 327, the DSP module 328, and/or the I/O interface 329.

The DVD control module 321 may use the buffer 322 and/or nonvolatile memory 323 to store data related to the control and operation of the DVD drive 318. The buffer 322 may include DRAM, SDRAM, etc. The nonvolatile memory 323 may include flash memory (including NAND and NOR flash memory), phase change memory, magnetic RAM, or multi-state memory, in which each memory cell has more than two states. The DVD PCB 319 includes a power supply 330 that provides power to the components of the DVD drive 318.

The DVDA 320 may include a preamplifier device 331, a laser driver 332, and an optical device 333, which may be an optical read/write (ORW) device or an optical read-only (OR) device. A spindle motor 334 rotates an optical storage medium 335, and a feed motor 336 actuates the optical device 333 relative to the optical storage medium 335.

When reading data from the optical storage medium 335, the laser driver provides a read power to the optical device 333. The optical device 333 detects data from the optical storage medium 335, and transmits the data to the preamplifier device 331. The analog front-end module 326 receives data from the preamplifier device 331 and performs such functions as filtering and A/D conversion. To write to the optical storage medium 335, the write strategy module 327 transmits power level and timing data to the laser driver 332. The laser driver 332 controls the optical device 333 to write data to the optical storage medium 335.

Figure 12D:
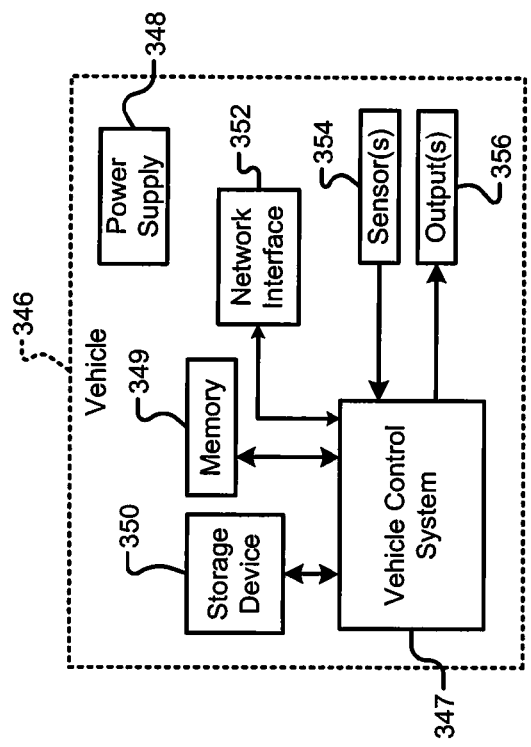
FIG. 12D is a functional block diagram of a vehicle control system.
Figure 12C:
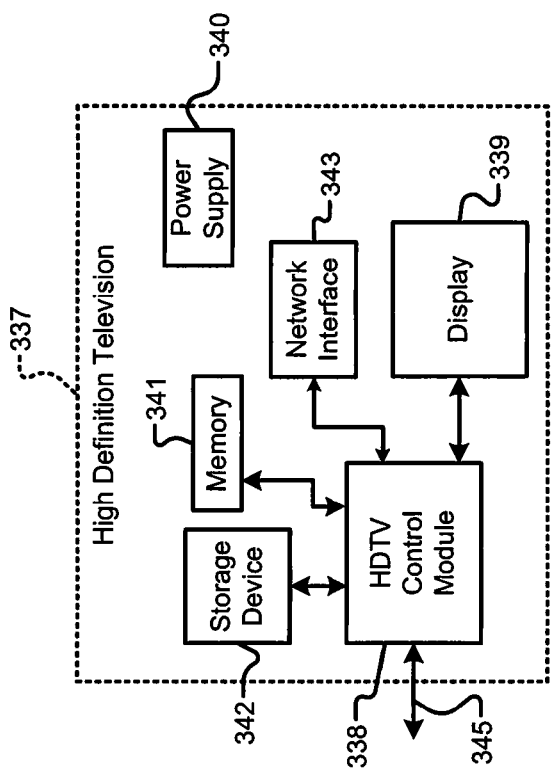
FIG. 12C is a functional block diagram of a high definition television.

Referring now to FIG. 12C, coding system 100 can be implemented in a storage device 342 of a high definition television (HDTV) 337. The HDTV 337 includes a HDTV control module 338, a display 339, a power supply 340, memory 341, storage device 342, a network interface 343, and an external interface 345. If the network interface 343 includes a wireless local area network interface, an antenna (not shown) may be included.

The HDTV 337 can receive input signals from the network interface 343 and/or the external interface 345, which can send and receive data via cable, broadband Internet, and/or satellite. The HDTV control module 338 may process the input signals, including encoding, decoding, filtering, and/or formatting, and generate output signals. The output signals may be communicated to one or more of the display 339, memory 341, the storage device 342, the network interface 343, and the external interface 345.

Memory 341 may include random access memory (RAM) and/or nonvolatile memory such as flash memory, phase change memory, or multi-state memory, in which each memory cell has more than two states. The storage device 342 may include an optical storage drive, such as a DVD drive, and/or a hard disk drive (HDD). The HDTV control module 338 communicates externally via the network interface 343 and/or the external interface 345. The power supply 340 provides power to the components of the HDTV 337.

Referring now to FIG. 12D, coding system 100 may be implemented in a storage device 350 of a vehicle 346. The vehicle 346 may include a vehicle control system 347, a power supply 348, memory 349, the storage device 350, and a network interface 352. If the network interface 352 includes a wireless local area network interface, an antenna (not shown) may be included. The vehicle control system 347 may be a powertrain control system, a body control system, an entertainment control system, an anti-lock braking system (ABS), a navigation system, a telematics system, a lane departure system, an adaptive cruise control system, etc.

The vehicle control system 347 may communicate with one or more sensors 354 and generate one or more output signals 356. The sensors 354 may include temperature sensors, acceleration sensors, pressure sensors, rotational sensors, airflow sensors, etc. The output signals 356 may control engine operating parameters, transmission operating parameters, suspension parameters, etc.

The power supply 348 provides power to the components of the vehicle 346. The vehicle control system 347 may store data in memory 349 and/or the storage device 350. Memory 349 may include random access memory (RAM) and/or nonvolatile memory such as flash memory, phase change memory, or multi-state memory, in which each memory cell has more than two states. The storage device 350 may include an optical storage drive, such as a DVD drive, and/or a hard disk drive (HDD). The vehicle control system 347 may communicate externally using the network interface 352.

Figure 12F:
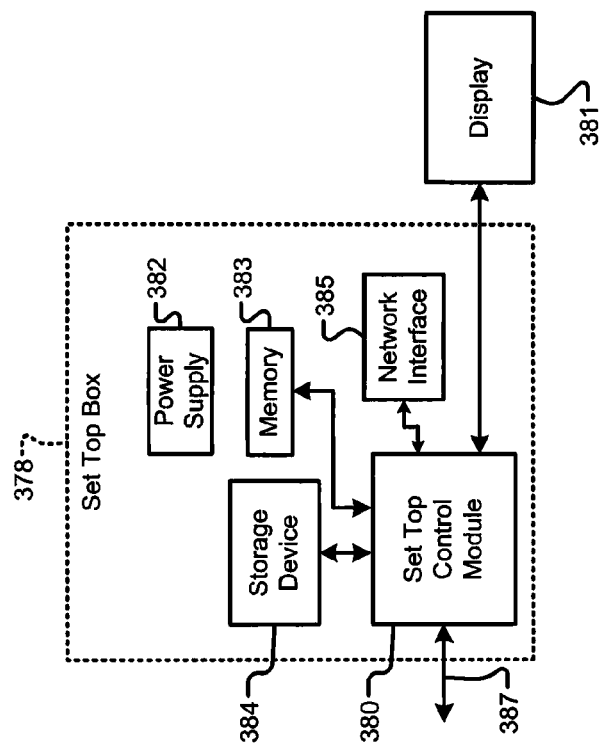
FIG. 12F is a functional block diagram of a set top box.
Figure 12E:
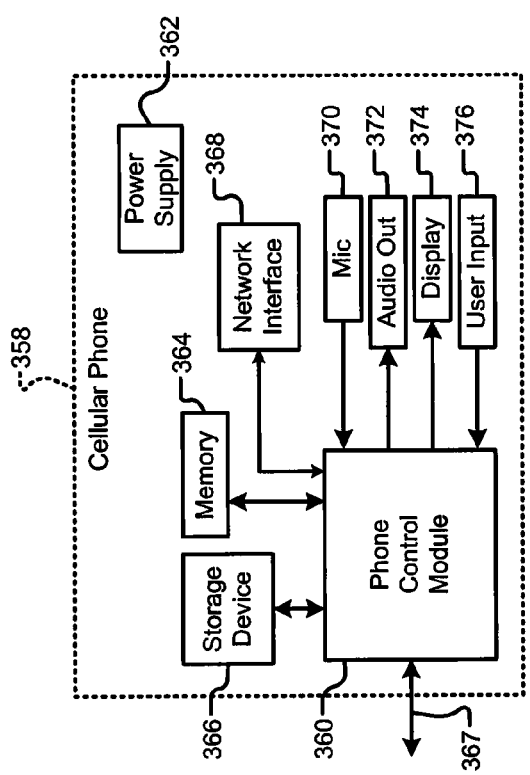
FIG. 12E is a functional block diagram of a cellular phone.

Referring now to FIG. 12E, coding system 100 can be implemented in a storage device 366 of a cellular phone 358. The cellular phone 358 includes a phone control module 360, a power supply 362, memory 364, the storage device 366, and a cellular network interface 367. The cellular phone 358 may include a network interface 368, a microphone 370, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 370, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory such as flash memory, phase change memory, or multi-state memory, in which each memory cell has more than two states. The storage device 366 may include an optical storage drive, such as a DVD drive, and/or a hard disk drive (HDD). The power supply 362 provides power to the components of the cellular phone 358.

Referring now to FIG. 12F, coding system 100 can be implemented in a storage device 384 of a set top box 378. The set top box 378 includes a set top control module 380, a display 381, a power supply 382, memory 383, the storage device 384, and a network interface 385. If the network interface 385 includes a wireless local area network interface, an antenna (not shown) may be included.

The set top control module 380 may receive input signals from the network interface 385 and an external interface 387, which can send and receive data via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory such as flash memory, phase change memory, or multi-state memory, in which each memory cell has more than two states. The storage device 384 may include an optical storage drive, such as a DVD drive, and/or a hard disk drive (HDD).

Referring now to FIG. 12G, coding system 100 can be implemented in a storage device of a mobile device 389. The mobile device 389 may include a mobile device control module 390, a power supply 391, memory 392, the storage device 393, a network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory such as flash memory, phase change memory, or multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A coding system for digital data, the coding system comprising:
 a bit insertion module configured to insert at least one bit location in an encoded data;
 an error correcting code (ECC) encoder module that generates ECC parity bits based on the at least one bit location and the encoded data; and
 an inner encoding module configured to
  generate inner-code parity bits based on the encoded data, and
  program the inner-code parity bits into the at least one bit location.

2. The coding system of claim 1, wherein a quantity of the inner-code parity bits is equal to a quantity of the at least one bit location.

3. The coding system of claim 1, further comprising a communication channel configured to receive (i) the inner-code parity bits and (ii) the encoded data.

4. The coding system of claim 3, further comprising an inner decoder module configured to:
 receive the inner-code parity bits and the encoded data from the communication channel; and
 generate decoded data based on (i) the inner-code parity bits and (ii) characteristics of the communication channel.

5. The coding system of claim 4, wherein the decoded data includes the at least one bit location.

6. The coding system of claim 5, further comprising a bit replacement module configured to erase the at least one bit location.

7. The coding system of claim 6, further comprising an ECC decoder module configured to:
 decode the decoded data based on the ECC; and
 preserve the at least one bit location.

8. The coding system of claim 7, further comprising a bit removal module configured to delete the at least one bit location from the decoded data that is generated by the ECC decoder module.

9. The coding system of claim 8, further comprising a constrained decoder module configured to decode the decoded data from the bit removal module based on a first constrained code used to generate the encoded data.

10. The coding system of claim 1, wherein the inner encoding module employs an inner code that is selected from a group consisting of: single parity codes, multi-parity codes, turbo codes, low-density parity check codes, and tensor-product codes.

11. The coding system of claim 1, further comprising:
 a constrained encoder module configured to generate the encoded data based on a first constrained code,
 wherein the first constrained code is selected from a group consisting of: run-length limited codes and direct current (DC)-free codes.

12. A method of coding digital data, the method comprising:
 inserting at least one bit location in an encoded data;
 generating error correcting code (ECC) parity bits based on the at least one bit location and the encoded data;
 generating inner-code parity bits based on the encoded data; and
 programming the inner-code parity bits into at least one bit location.

13. The method of claim 12, wherein a quantity of the inner-code parity bits is equal to a quantity of the at least one bit location.

14. The method of claim 12, further comprising:
 receiving the inner-code parity bits and the encoded data from a communication channel; and
 generating decoded data based on (i) the inner-code parity bits and (ii) characteristics of the communication channel.

15. The method of claim 14, wherein the decoded data includes the at least one bit location.

16. The method of claim 15, further comprising erasing the at least one bit location.

17. The method of claim 16, further comprising:
 decoding the decoded data based on the ECC; and
 preserving the at least one bit location.

18. The method of claim 12, further comprising employing an inner code that is selected from a group consisting of: single parity codes, multi-parity codes, turbo codes, low-density parity check codes, and tensor-product codes.

19. The method of claim 12, further comprising:
 generating the encoded data based on a first constrained code,
 wherein the first constrained code is selected from a group consisting of: run-length limited codes and direct current (DC)-free codes.

* * * * *